(12) United States Patent
Koopmans et al.

(10) Patent No.: US 9,269,700 B2
(45) Date of Patent: Feb. 23, 2016

(54) STACKED SEMICONDUCTOR DIE ASSEMBLIES WITH IMPROVED THERMAL PERFORMANCE AND ASSOCIATED SYSTEMS AND METHODS

(71) Applicant: Micron Technology, Inc., Boise, ID (US)

(72) Inventors: Michel Koopmans, Boise, ID (US); Shijian Luo, Boise, ID (US); David R. Hembree, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/231,101

(22) Filed: Mar. 31, 2014

(65) Prior Publication Data

US 2015/0279828 A1    Oct. 1, 2015

(51) Int. Cl.

| H01L 23/02 | (2006.01) |
|---|---|
| H01L 25/18 | (2006.01) |
| H01L 23/34 | (2006.01) |
| H01L 23/00 | (2006.01) |
| H01L 25/00 | (2006.01) |

(52) U.S. Cl.
CPC ............... *H01L 25/18* (2013.01); *H01L 23/34* (2013.01); *H01L 24/17* (2013.01); *H01L 24/81* (2013.01); *H01L 25/50* (2013.01); *H01L 2924/1431* (2013.01); *H01L 2924/1434* (2013.01)

(58) Field of Classification Search
CPC ........................................................ H01L 23/02
USPC ........................................................ 257/678
See application file for complete search history.

(56) References Cited

U.S. PATENT DOCUMENTS

| 8,263,434 B2 | 9/2012 | Pagaila et al. |
|---|---|---|
| 8,344,512 B2 | 1/2013 | Knickerbocker |
| 2004/0212069 A1 | 10/2004 | Chen et al. |
| 2007/0216001 A1 | 9/2007 | Nakamura et al. |
| 2008/0099909 A1 | 5/2008 | Baek et al. |

(Continued)

FOREIGN PATENT DOCUMENTS

WO    2013095544 A1    6/2013

OTHER PUBLICATIONS

Goering, Richard. Wide I/O 2, Hybrid Memory Cube (HMC)—Memory Models Advance 3D-IC Standards. Aug. 3, 2013. <URL: http://www.cadence.com/Community/blogs/ii/archive/2013/08/06/wide-i-o-2-hybrid-memory-cube-hmc-memory-models-advance-3d-ic-standards.aspx>.

Lee, Choon Heung. The Trend of TSV Packaging. Amkor Technology. 2011. 24 pages. <URL: http://www.sematech.org/meetings/archives/symposia/10202/Keynote-Intro/Lee_The%20Trend%20of%20TSV%20Packaging.pdf>.

Sunohara, Masahiro et al. "Silicon Interposer with TSVs (Through Silicon Vias) and Fine Multilayer Wiring," IEEE 2008 Electronic Components and Technology Conference, May 2008, pp. 847-849, DOI: 10.1109/ECTC.2008.4550075.

(Continued)

*Primary Examiner* — Yasser A Abdelaziez
*Assistant Examiner* — Hajar Kolahdouzan
(74) *Attorney, Agent, or Firm* — Perkins Cole LLP

(57) ABSTRACT

Stacked semiconductor die assemblies with improved thermal performance and associated systems and methods are disclosed herein. In one embodiment, a semiconductor die assembly can include a stack of semiconductor dies and a thermally conductive casing at least partially enclosing the stack of semiconductor dies within an enclosure. A package substrate carries the thermally conductive casing, and an interposer is disposed between the thermally conductive casing and the stack of semiconductor dies. A peripheral portion of the interposer extends laterally beyond the stack of semiconductor dies and is coupled to a plurality of conductive members interposed between the peripheral portion and the package substrate.

(56) References Cited

U.S. PATENT DOCUMENTS

2012/0007229 A1* 1/2012 Bartley ............... H01L 23/055
 257/712
2012/0146207 A1 6/2012 Chou et al.
2013/0119528 A1 5/2013 Groothuis et al.

OTHER PUBLICATIONS

International Search Report and Written Opinion mailed Jun. 30, 2015 in Application No. PCT/US2015/023377, 12 pages.

* cited by examiner

STACKED SEMICONDUCTOR DIE ASSEMBLIES WITH IMPROVED THERMAL PERFORMANCE AND ASSOCIATED SYSTEMS AND METHODS

TECHNICAL FIELD

The disclosed embodiments relate to semiconductor die assemblies and to managing heat within such assemblies. In particular, the present technology relates to stacked semiconductor device assemblies having a thermally conductive casing and an interposer directly attached to the casing.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

In vertically stacked packages, the heat generated is difficult to dissipate, which increases the operating temperatures of the individual dies, the junctions therebetween, and the package as a whole. This can cause the stacked dies to reach temperatures above their maximum operating temperatures ($T_{max}$) in many types of devices.

DETAILED DESCRIPTION

Specific details of several embodiments of stacked semiconductor die assemblies with improved thermal performance and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. A person skilled in the relevant art will also understand that the technology may have additional embodiments, and that the technology may be practiced without several of the details of the embodiments described below with reference to FIGS. 1-6.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1:
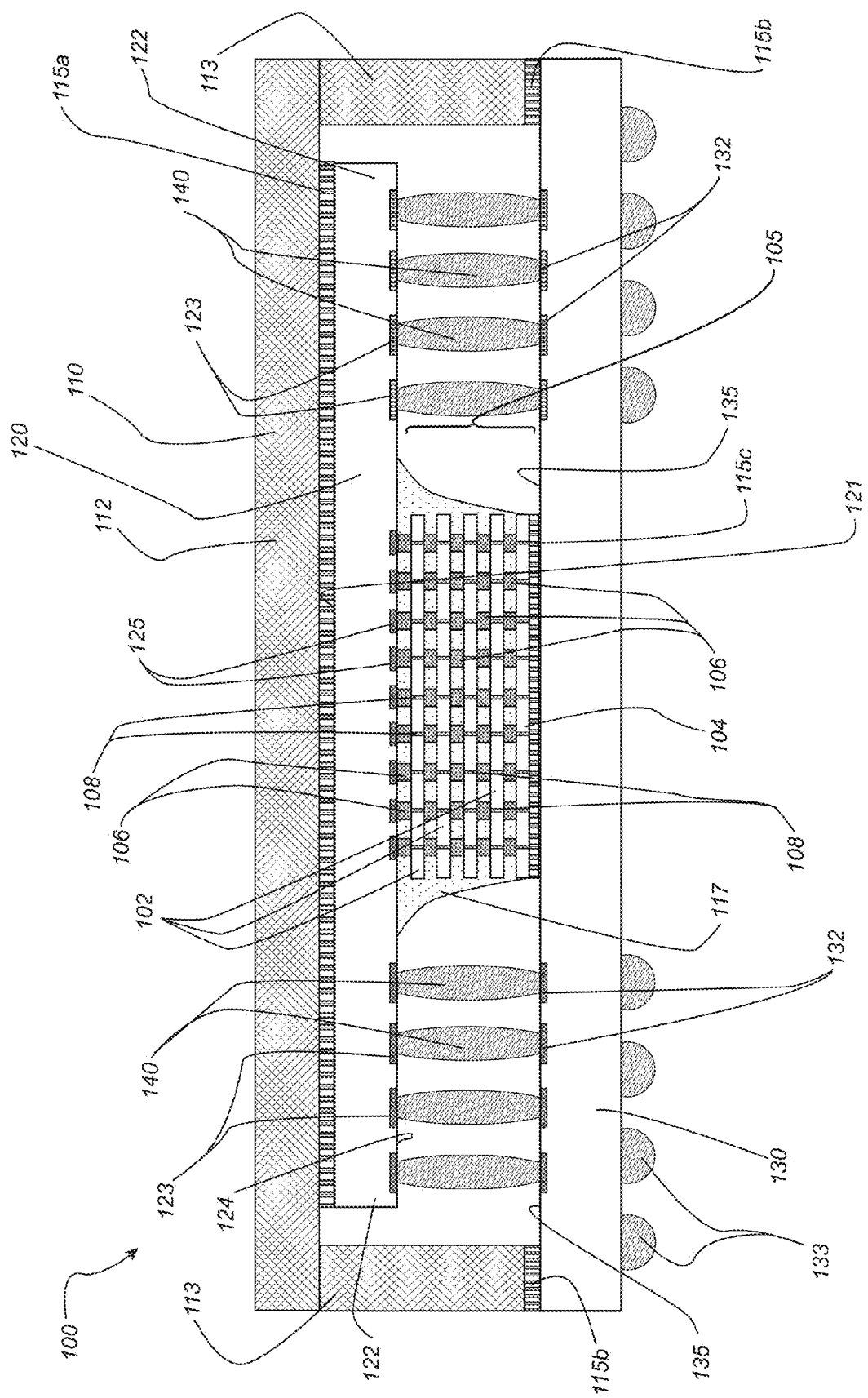
FIGS. 1-5 are cross-sectional views of semiconductor die assemblies configured in accordance with selected embodiments of the present technology.

FIG. 1 is a cross-sectional view of a semiconductor die assembly 100 ("assembly 100") configured in accordance with an embodiment of the present technology. The assembly 100 includes a plurality of semiconductor dies 102 arranged in a stack 105 ("die stack 105") and a thermally conductive casing ("casing 110") attached to an interposer 120 interposed between the casing 110 and the die stack 105. The interposer 120 includes a peripheral portion 122 that extends laterally beyond the outer periphery or footprint of the die stack 105 along at least one axis. The peripheral portion 122 includes a plurality of bond pads 123 coupled to corresponding bond pads 132 of a package substrate 130 by individual conductive members, such as solder bumps 140, interposed between the peripheral portion 122 and the package substrate 130. The package substrate 130 can include, for example, an interposer, printed circuit board, or other suitable substrate having electrical connectors 133 (e.g., solder bumps) that connect the assembly 100 to external circuitry (not shown).

In the illustrated embodiment of FIG. 1, the solder bumps 140 can include metal solder balls. In several embodiments, the solder bumps 140 can have a vertical height that is equal to or greater than the vertical height of the die stack 105. For example, the solder bumps 140 can have a vertical height in the range of from about 200 μm to about 1 mm or more depending on the vertical height of the die stack 105. The pitch of the solder bumps can likewise vary based on the vertical height of the solder bumps. Further, while the solder bumps 140 are shown in the illustrated embodiment as having a pitch that is less than their vertical height, in other embodiments the pitch can be the same as or larger than the vertical height.

The casing 110 includes a cap portion 112 and wall portions 113 attached to or integrally formed with the cap portion 112. The cap portion 112 can be attached to a back side surface 121 of the interposer 120 by a first interface material 115a (e.g., an adhesive). The wall portions 113 extend vertically away from the cap portion 112 and attach to a peripheral or upper surface 135 of the package substrate 130 by a second interface material 115b (e.g., an adhesive). In the illustrated embodiment, the casing 110 at least partially encloses the die stack 105 within an enclosure (e.g., a cavity). In other embodiments, the casing 110 can be configured differently or omitted. For example, in one embodiment the wall portions 113 can be omitted from the casing 110. In addition to providing a protective covering, the casing 110 can function as a heat spreader that absorbs and dissipates thermal energy away from the die stack 105. The casing 110 can accordingly be made from a thermally conductive material, such as nickel, copper, aluminum, ceramic materials with high thermal conductivities (e.g., aluminum nitride), and/or other suitable thermally conductive materials.

In some embodiments, the first interface material 115a and/or the second interface material 115b can be made from what are known in the art as "thermal interface materials" or "TIMs", which are designed to increase the thermal conductance at surface junctions (e.g., between a die surface and a heat spreader). TIMs can include silicone-based greases, gels, or adhesives that are doped with conductive materials (e.g., carbon nano-tubes, solder materials, diamond-like carbon (DLC), etc.), as well as phase-change materials. In some embodiments, for example, the thermal interface materials can be made from X-23-7772-4 TIM manufactured by Shin-Etsu MicroSi, Inc. of Phoenix, Ariz., which has a thermal conductivity of about 3-4 W/m° K. In other embodiments, the first interface material 115a and/or the second interface material 115b can include other suitable materials, such as metals (e.g., copper) and/or other suitable thermally conductive materials.

In several embodiments, the die stack 105 can be attached to the package substrate 130 by a third interface material 115c, such as an adhesive, a die attach material (e.g., a die attach film or paste), a dielectric spacer, or other suitable material. In one embodiment, the third interface material 115c is a dielectric material that electrically isolates the die stack 105 from the package substrate 130 beneath the stack 105. In another embodiment, the third interface material 115c can include an interface material (e.g., a TIM) used for the first interface material 115a and/or the second interface material 115b. In other embodiments, the third interface material 115c can be omitted. For example, in one embodiment the interposer 120 can carry the die stack 105 above the package substrate 130 such that the die stack 105 and the package substrate 130 are separated by a gap (e.g., an air gap).

The die stack 105 can be electrically coupled to the interposer 120 and to one another by a plurality of interconnects 106 (e.g., copper pillars, solder bumps, and/or other conductive features). For example, a portion of the interconnects 106 can be attached to corresponding bond pads 125 located at an active surface 124 of the interposer 120. Each of the semiconductor dies 102 can include a plurality of through-substrate interconnects 108 (e.g., through-substrate vias, TSVs, etc.) that are coupled on opposite sides to the interconnects 106. The interconnects and the through-substrate interconnects 106 and 108 can be formed from various types of conductive materials (e.g., metallic materials), such as copper, nickel, aluminum, etc. In some embodiments, the conductive materials can include solder (e.g., SnAg-based solder), conductor-filled epoxy, and/or other electrically conductive materials. In selected embodiments, for example, the interconnects 106 can be copper pillars, whereas in other embodiments the interconnects 106 can include more complex structures, such as bump-on-nitride structures. In other embodiments, the interconnects 106 can be replaced with other types of materials or structures, such as a conductive paste.

In addition to electrical communication, the interconnects 106 and the through-substrate interconnects 108 transfer heat away from the die stack 105 and toward the casing 110. In some embodiments, the through-substrate interconnects 108 of an outer-most die 104 of the die stack 110 can also transfer heat from the die stack 110 to the package substrate 130. For example, the through-substrate interconnects 108 can be in direct contact with the third interface material 115c. In several embodiments, the assembly 100 can also include a plurality of thermally conductive elements or "dummy elements" (not shown) positioned interstitially between the semiconductor dies 102 to further facilitate heat transfer through the die stack 105. Such dummy elements can be at least generally similar in structure and composition as the interconnects 106 and/or the through-substrate interconnects 108 except that they are not electrically coupled to the other circuitry of the semiconductor dies 102.

An underfill material 117 can be deposited or otherwise formed around and/or between some or all of the semiconductor dies 102 of the die stack 105 to electrically isolate the interconnects 106 from one another and/or enhance the mechanical connection between the semiconductor dies 102. The underfill material 117 can be a non-conductive epoxy paste (e.g., XS8448-171 manufactured by Namics Corporation of Niigata, Japan), a capillary underfill, a non-conductive film, a molded underfill, and/or include other suitable electrically-insulative materials. In some embodiments, the underfill material 117 can be selected based on its thermal conductivity to enhance heat dissipation through the die stack 105.

The semiconductor dies 102 can each be formed from a semiconductor substrate, such as silicon, silicon-on-insulator, compound semiconductor (e.g., Gallium Nitride), or other suitable substrate. The semiconductor substrate can be cut or singulated into semiconductor dies having any of a variety of circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a hybrid memory cube (HMC) in which some of the semiconductor dies 102 provide data storage (e.g., DRAM dies) and at least one of the semiconductor dies 102 provides memory control (e.g., DRAM control) within the HMC. In some embodiments, the semiconductor dies 102 may include other circuit components in addition to and/or other than data storage and/or memory control components. Further although the die stack 105 shown in FIG. 1 includes five dies, in other embodiments the stack 105 can include fewer than five dies (e.g., three dies) or more than five dies (e.g., eight dies, ten dies, twelve dies, etc.). For example, in one embodiment the die stack 105 can include nine dies rather than five dies.

The interposer 120 can include a printed circuit board, a semiconductor substrate, or other suitable substrate that is formed without integrated circuit components. For example, the interposer 120 can include a "blank" substrate formed from crystalline, semi-crystalline, and/or ceramic substrate materials, such as silicon, polysilicon, aluminum oxide ($Al_2O_3$), sapphire, and/or other suitable materials. In one aspect of this embodiment, the interposer 120 can be formed without through-substrate interconnects because it is disposed toward the top of the assembly 100 rather than the bottom of the assembly. For example, conventional semiconductor die packages have the interposer disposed between the package substrate and the semiconductor die stack. This arrangement requires the interposer to have through-substrate interconnects to electrically connect the package substrate with the semiconductor die stack. This arrangement also requires the interposer to be thin to reduce the vertical height and the aspect ratio of the through-substrate interconnects. For example, conventional interposers (or the substrates used to form the interposers) can be thinned to size by backgrinding, etching, and/or chemical mechanical polishing (CMP). One advantage, therefore, with the interposer 120 located toward the top of the assembly is that the interposer 120 can be relatively thick and thus eliminate a number of manufacturing steps. For example, substrate thinning, through-hole etching, and metal deposition processes for forming through-substrate interconnects can be eliminated. Another advantage is that the increased thickness of the interposer 120 can facilitate heat transfer laterally away from the die stack 105 and toward the peripheral portion 122 of the interposer.

Figure 2:
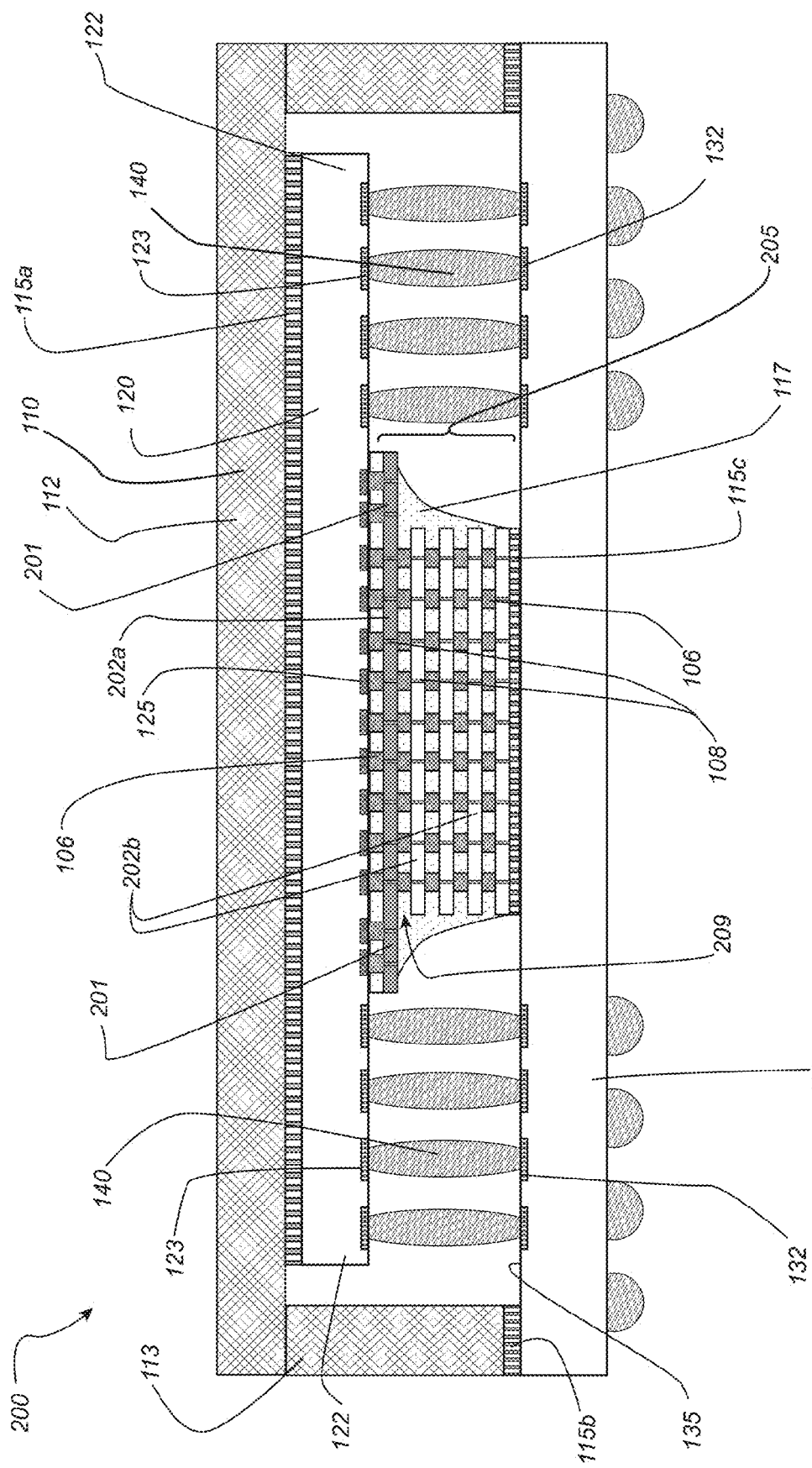

FIG. 2 is a cross-sectional view of a semiconductor die assembly 200 ("assembly 200") configured in accordance with another embodiment of the present technology. The assembly 200 can include features generally similar to those of the assembly 100. For example, the assembly 200 includes the interposer 120 enclosed within the casing 110 and attached to a semiconductor die stack 205 ("die stack 205"). In the illustrated embodiment of FIG. 2, the die stack 205 includes a logic die 202a interposed between a plurality of memory dies 202b. The logic die 202a can include, for example, a memory controller, a serializer/deserializer circuit, and/or other integrated circuit components. The individual memory dies 202b can include, for example, arrays or blocks of memory cells operably coupled to the integrated circuit components of the logic die 202a via the interconnects 106 and the through-substrate interconnects 108.

In one aspect of this embodiment, the arrangement of the interposer 120 between the logic die 202a and the casing 110 can reduce the amount of heat produced by the die stack 205 during operation. In general, the heat produced by a logic die (e.g., the logic die 202a) can be significantly larger than the heat collectively produced by memory dies (e.g., the memory dies 202b). For instance, a logic die in an HMC assembly can consume 80% of the overall power during operation. In conventional semiconductor die assemblies, the logic die is positioned with the interposer toward the bottom of the assembly. As such, heat from the logic die transfers through the memory dies en route to the casing of the assembly, which increases the overall temperature of the assembly. As temperature approaches or increases beyond the maximum operating temperature ($T_{max}$), the operating performance of the assembly declines. For example, processing speeds (e.g., of the logic die) often need to be reduced to maintain operation at an acceptable temperature. In some instances, for example, data throughput needs to be reduced to one fourth of the maximum throughput level so that the assembly stays at or below $T_{max}$. By contrast, HMC and other die assemblies configured in accordance with several embodiments of the present technology can reduce the flow of heat through the memory dies 202b. In particular, the interposer 120 positions the logic die 202a proximal to the casing 110 to direct the flow of heat away from the memory dies 202b. This, in turn, can enable the logic die 202a and the memory dies 202b to operate below $T_{max}$ and thus operate at faster speeds and with more data throughput.

In the illustrated embodiment of FIG. 2, the footprint of the logic die 202a is larger than the individual memory dies 202b along at least one axis. In one aspect of this embodiment, certain integrated circuit components of the logic die 202a can be formed toward an outer portion 201 of the logic die 202a that is peripheral to a junction 209 between the logic die 202a and the memory dies 202b. For example, circuits with higher operating temperature (e.g., serializer/deserializer circuits) can be formed toward the outer portion 201. With these circuits positioned toward the outer portion 201, the junction 209 transfers less heat and the die stack 205 can thus operate at lower operating temperatures.

Figure 3:
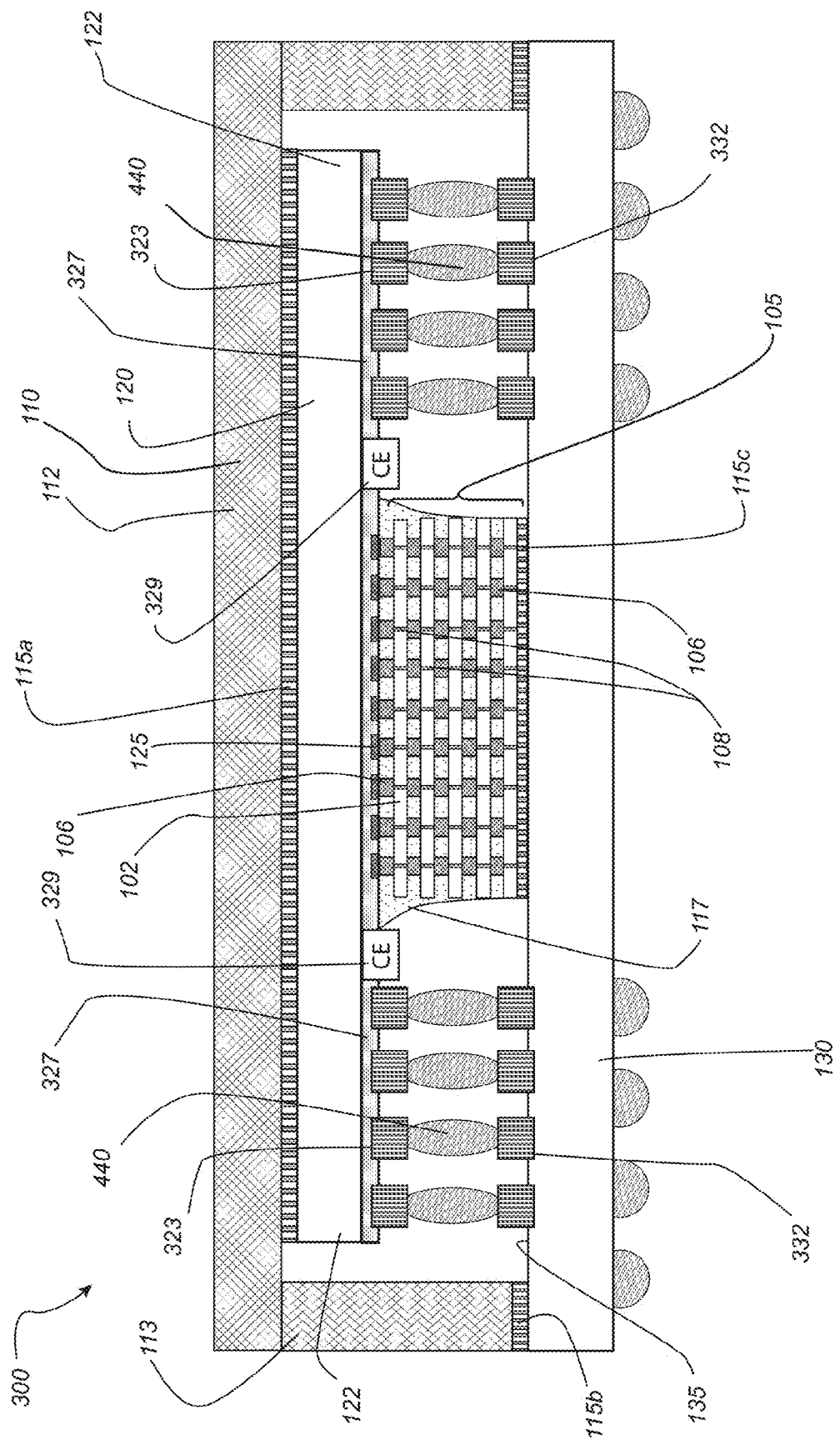

FIG. 3 is a cross-sectional view of a semiconductor die assembly 300 ("assembly 300") configured in accordance with another embodiment of the present technology. The assembly 300 can include features generally similar to those of the assembly 100. For example, the assembly 300 includes the interposer 120 enclosed within the casing 110 and attached to the die stack 105. In the illustrated embodiment of FIG. 3, the assembly 300 includes conductive members, or solder bumps 440, disposed between raised bond pads 323 and 332. In several embodiments, the height of the bond pads 323 can be configured to accommodate solder bumps of various sizes and/or pitch. In addition or alternately, the height of the bond pads 323 and/or 332 can be selected to accommodate various heights of the die stack 105. Further, in some embodiments only one set of the bond pads 323 and 332 may be raised.

As further shown in FIG. 3, the interposer 120 includes a redistribution network 327 of, e.g., conductive traces, bond pads, and/or other suitable conductive structures electrically coupled between the bond pads 323 and 125. As shown, the redistribution network 327 can include one or more circuit elements 329 (shown schematically) coupled between the bond pads 323 and 125. In several embodiments, the circuit elements 329 can include capacitors, resistors, and/or other suitable circuits elements. For example, the circuit elements 329 can include large-area metal capacitors and/or inductors configured to condition the voltage or power provided to the die stack 105 by a power supply (not shown).

Figure 4:
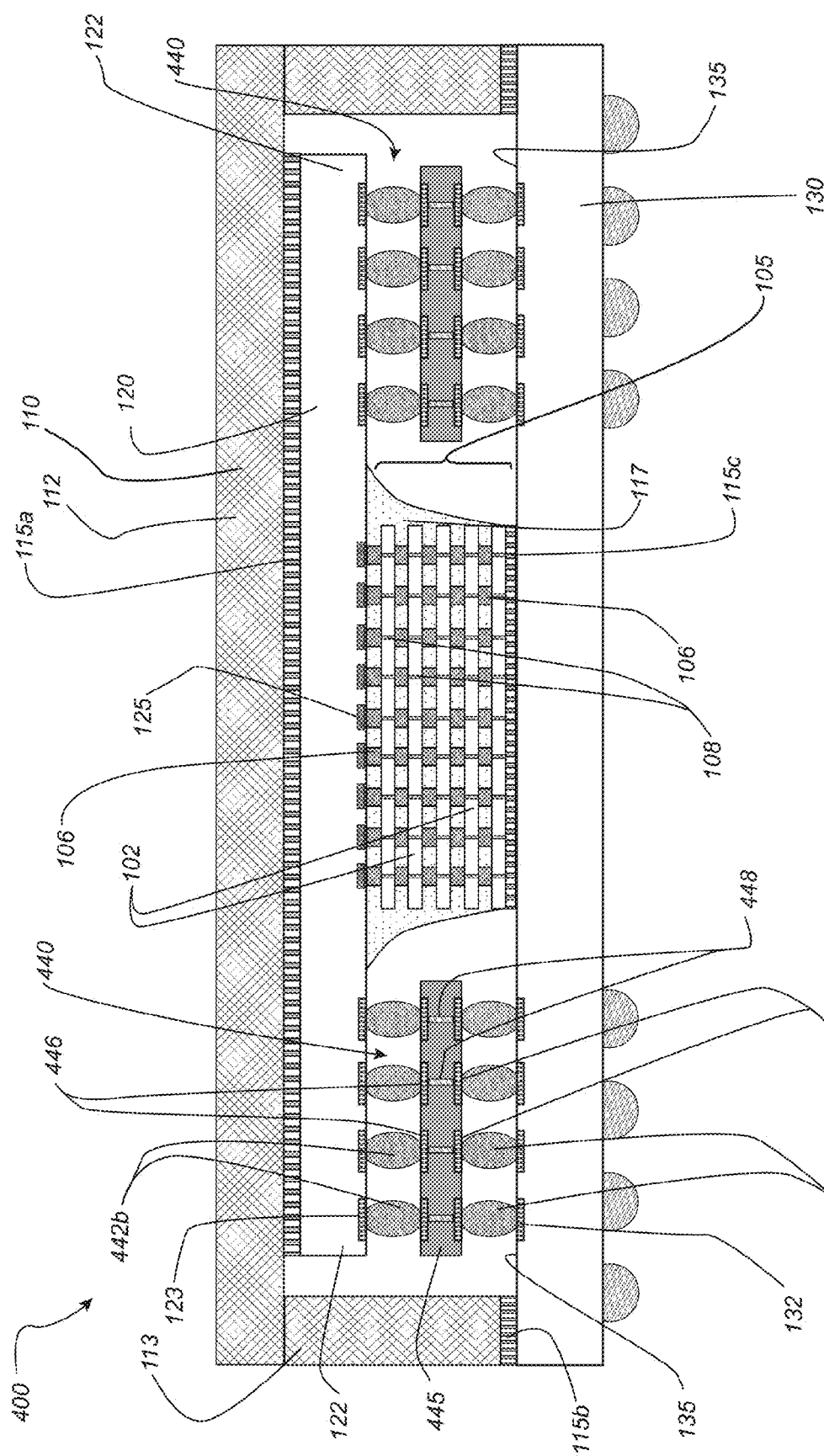

FIG. 4 is a cross-sectional view of a semiconductor die assembly 400 ("assembly 400") configured in accordance with another embodiment of the present technology. The assembly 400 can include features generally similar to those of the assembly 100 of FIG. 1. For example, the assembly 400 includes the interposer 120 enclosed within the casing 110 coupled to conductive structures 440 interposed between the peripheral portion 122 and the package substrate 130. In the illustrated embodiment of FIG. 4, each of the conductive structures 440 can include first solder bumps 442a coupled between the bond pads 132 of the package substrate 130 and corresponding bond pads 444 on an intermediary support 445. The intermediary support 445 can include through-substrate interconnects 448 that electrically couple the bond pads 444 to corresponding bond pads 446 on an opposite side of the intermediary support 445. The bond pads 446 can, in turn, be coupled to the bond pads 123 of the interposer 120 by second solder bumps 442b.

In one aspect of this embodiment, the intermediary support 145 can reduce the height of the first and second solder bumps 442a and 442b relative to the height of the solder bumps 140 (FIG. 1). In some embodiments, the first and second solder bumps 442a and 442b can be smaller and the conductive structures 440 can include additional levels of intermediary supports and solder bumps to further reduce the height of the solder bumps. For example, in some embodiments conductive structures can include two or more intermediary supports with solder bumps disposed between each of the intermediary supports. In several embodiments, the intermediary support 445 can include a singular structure that at least partially surrounds the perimeter of the die stack 105. For example, the intermediary support 445 can include a patterned interposer having an opening that receives the die stack 105. In another embodiment, the intermediary support 445 can include a metallic frame. In other embodiments, the intermediary support 445 can include discrete elements between a pair of solder bumps or between multiple pairs of solder bumps.

Figure 5:
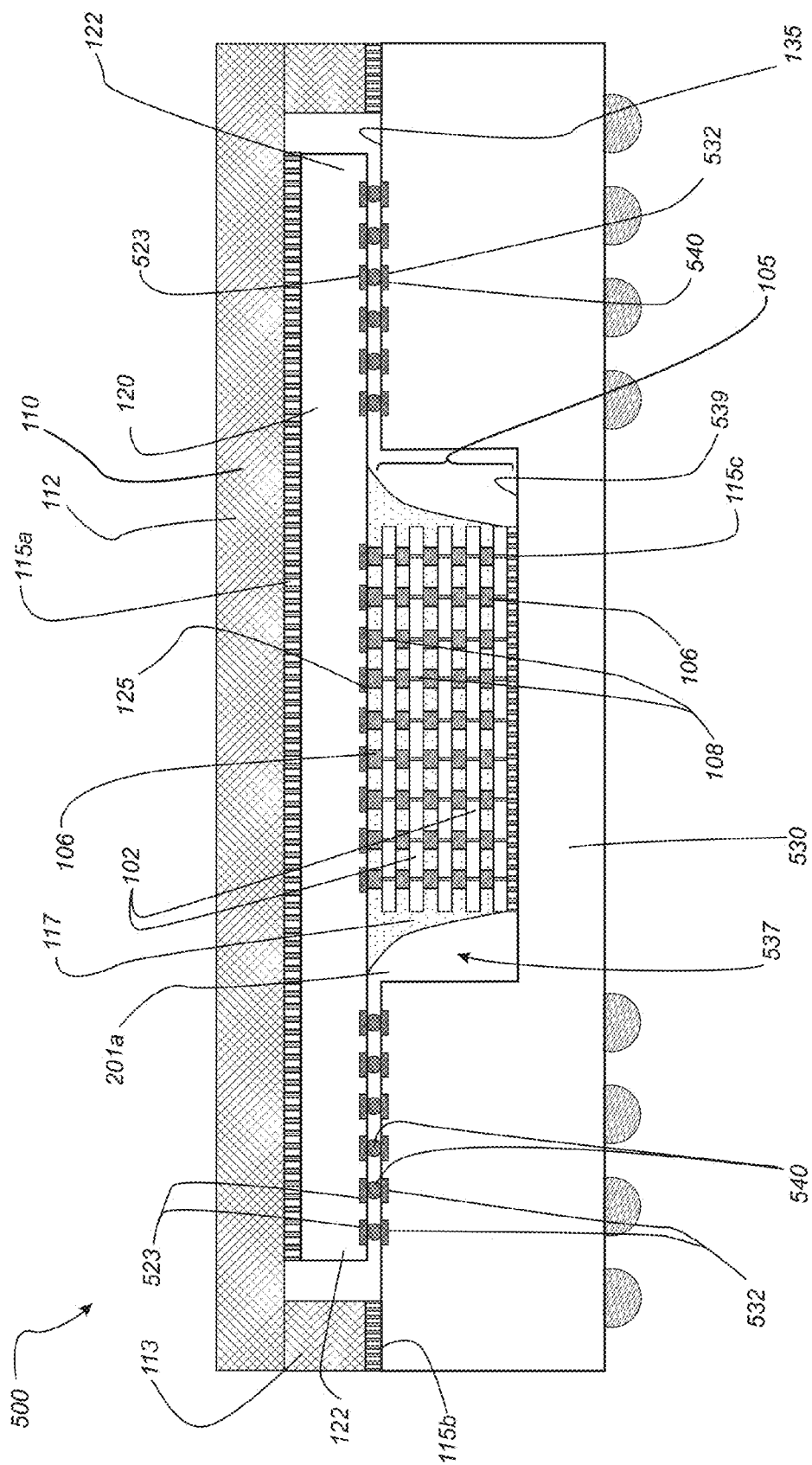

FIG. 5 is a cross-sectional view of a semiconductor die assembly 500 ("assembly 500") configured in accordance with another embodiment of the present technology. The assembly 500 can include features generally similar to those of the assembly 100 of FIG. 1. For example, the assembly 500 includes the interposer 120 enclosed within the casing 110 and attached to a package substrate 530. In the illustrated embodiment of FIG. 5, the package substrate 530 includes a cavity 537 having a recessed surface 539 recessed below the upper surface 135 of the package substrate 530 and attached to the die stack 105 by the third interface material 115c. The interposer 120 is coupled to a plurality of solder bumps 540 located outside of the cavity 537 between bond pads 523 of the interposer 120 and corresponding bond pads 532 of the package substrate 530. In several embodiments, the solder bumps 540 can be similar to the solder bumps of 140 of FIG. 1, but have a smaller vertical height and/or pitch.

In several embodiments, the vertical profile (e.g., height) of the assembly 500 is less than the vertical profile of the assemblies 100-400 described in detail above with reference to FIGS. 1-4, respectively. In various embodiments, the vertical profile of the assembly 500 can be dictated in part by the depth of the cavity 537 and/or the vertical height of the die stack 105 within the cavity 537. Although the die stack 105 shown in FIG. 5 is completely disposed within the cavity 537, in other embodiments, a portion of the die stack 105 can extend at least partially outside of the cavity 537 (e.g., when the die stack 105 has a height that is greater than the depth of the cavity 537). In one embodiment, a logic die (not shown) can be carried outside of the cavity 537 while memory dies (not shown) can remain within the cavity 537. Further, in some embodiments the solder bumps 540 outside the cavity can have the same height as the portion of interconnects 106 between the interposer 120 and the die stack 105, while in other embodiments, the solder bumps 540 can have a different height (e.g., a greater height) than this portion of the interconnects 106.

Figure 6:
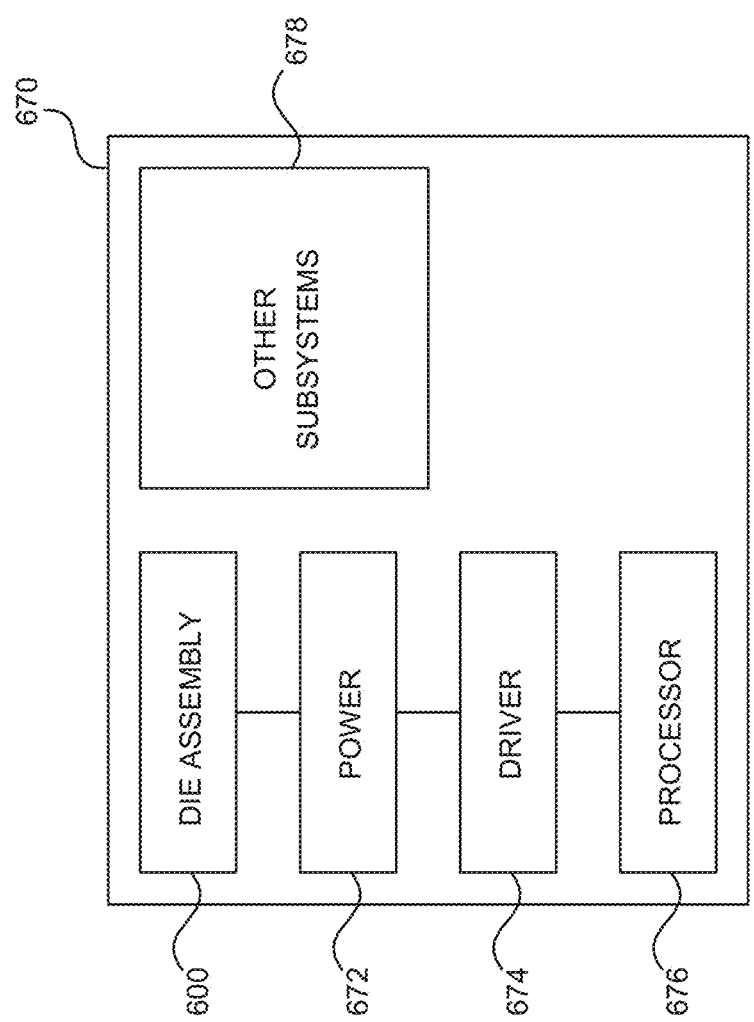
FIG. 6 is a schematic view of a system that includes a semiconductor die assembly configured in accordance with embodiments of the present technology.

Any one of the stacked semiconductor die assemblies described above with reference to FIGS. 1-5 can be incorporated into any of a myriad of larger and/or more complex systems, a representative example of which is system 670 shown schematically in FIG. 6. The system 670 can include a semiconductor die assembly 600, a power source 672, a driver 674, a processor 676, and/or other subsystems or components 678. The semiconductor die assembly 600 can include features generally similar to those of the stacked semiconductor die assemblies described above, and can therefore include various features that enhance heat dissipation. The resulting system 670 can perform any of a wide variety of functions, such as memory storage, data processing, and/or other suitable functions. Accordingly, representative systems 670 can include, without limitation, hand-held devices (e.g., mobile phones, tablets, digital readers, and digital audio players), computers, and appliances. Components of the system 670 may be housed in a single unit or distributed over multiple, interconnected units (e.g., through a communications network). The components of the system 670 can also include remote devices and any of a wide variety of computer readable media.

From the foregoing, it will be appreciated that specific embodiments of the technology have been described herein for purposes of illustration, but that various modifications may be made without deviating from the disclosure. For example, although many of the embodiments of the semiconductor dies assemblies are described with respect to HMCs, in other embodiments the semiconductor die assemblies can be configured as other memory devices or other types of stacked die assemblies. In addition, while in the illustrated embodiments certain features or components have been shown as having certain arrangements or configurations, other arrangements and configurations are possible. For example, the solder bumps 140 of FIG. 1 can be disposed at a single side of the die stack 105 rather than at both side or multiple sides. Also, the solder bumps 140 can include a larger or smaller number of solder bumps than shown in the illustrated embodiments. Further, in certain embodiments the logic die 202a of FIG. 2 can be disposed between the memory dies 202b and the package substrate 130 rather than between the memory dies 202b and the interposer 120. In addition, certain aspects of the new technology described in the context of particular embodiments may also be combined or eliminated in other embodiments. For example, the assembly 500 of FIG. 5 can include the circuit elements 329 of the redistribution network 327 of FIG. 3. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor die assembly, comprising:
a stack of semiconductor dies having a vertical height;
a thermally conductive casing;
an interposer between the thermally conductive casing and the stack of semiconductor dies, wherein a peripheral portion of the interposer extends laterally beyond the stack of semiconductor dies; a package substrate carrying the thermally conductive casing; and a plurality of conductive members interposed between the package substrate and the peripheral portion of the interposer, wherein each of the conductive members includes a solder bump having a vertical height that is about equal to or greater than the vertical height of the stack of semiconductor dies.

2. The die assembly of claim 1 wherein the thermally conductive casing includes:
a cap portion attached to a back side surface of the interposer; and
a wall portion extending vertically between the cap portion and the package substrate;
wherein the wall portion is attached to an outer surface of the package substrate.

3. The dies assembly of claim 2 wherein the stack of semiconductor dies includes:
a stack of memory dies; and
a logic die disposed between the stack of memory dies and the interposer.

4. The die assembly of claim 1 wherein the die assembly further comprises an interface material interposed between the package substrate and the stack of semi conductor dies.

5. The die assembly of claim 4 wherein:
the interface material is electrically insulative;
the stack of semiconductor dies includes an outermost die having a plurality of through substrate interconnects extending therethough; and
the plurality of through-substrate interconnects contact the irate ace material.

6. The dies assembly of claim 1 wherein the stack of semiconductor dies further comprises:
a stack of memory dies having a first footprint; and
a logic die having a second footprint that is larger than the first footprint along at least one axis of the stack of memory dies.

7. The dies assembly of claim 6 wherein the interposer has a third footprint that is larger than the second footprint along at least one axis of the logic die.

8. The dies assembly of claim 6 wherein the solder bump includes a metal solder ball.

9. The die assembly of claim 1 wherein the interposer includes a redistribution network electrically coupling the conductive members to the stack of semiconductor dies, and wherein the redistribution network includes a circuit element coupled between at least one of the conductive members and the stack of semiconductor dies.

10. The die assembly of claim 9 wherein the circuit element includes a capacitor.

11. A semiconductor die assembly, comprising: a thermally conductive casing; a package substrate, wherein the package substrate and the thermally conductive casing together define an enclosure, and wherein the package substrate includes a plurality of first bond pads;
an interposer attached to the thermally conductive casing within the enclosure, wherein the interposer includes a plurality of second bond pads facing corresponding ones of the first bond pads and separated therefrom by a gap;
a stack of semiconductor dies disposed between the interposer and the package substrate within the enclosure, wherein the stack of semiconductor dies includes a first outermost die having an outer surface adjacent the interposer, and a second outermost die having an outer surface adjacent the package substrate, and wherein the outer surfaces of the first and second outermost dies are spaces apart from one another by a first distance; and
a plurality of solder bumps, wherein each of the solder bumps is attached to one of the first bond pads and a corresponding one of the second bond pads, and wherein each of the solder bumps extends a second distance across the gap that is about equal to or greater than the first distance.

12. The die assembly of claim 11 wherein the individual solder bumps include a metal solder ball.

13. A method of forming a semiconductor die assembly, comprising: attaching stack of semiconductor dies to an interposer, wherein the stack of semiconductor dies has a vertical height;
forming solder bumps between a package substrate and an active surface at a peripheral portion of the interposer;
attaching a thermally conductive casing to a back side surface of the interposer opposite the active surface to least partially enclose the interposer and the stack of semiconductor dies within an enclosure; and
attaching the stack of semiconductor dies to the package substrate such that the solder bumps extend vertically between the active surface and the package substrate, wherein the solder bumps have a vertical height that is about equal to or greater than the vertical height of the stack of semiconductor dies.

14. The method of claim 13 wherein the method further includes attaching the thermally conductive casing to the package substrate.

15. The method of claim 13 wherein forming the solder bumps includes attaching each of the solder bumps to a bond pad on the interposer and to a corresponding bond pad on the package substrate.

16. The method of claim 13 wherein forming the solder bumps includes attaching the solder bumps to first bond pads on the interposer and corresponding second bond pads on the package substrate.

17. The method of claim 13 wherein the stack of semiconductor dies includes a stack of memory dies attached to a logic die, and wherein attaching the stack of semiconductor dies to the interposer further includes attaching the logic die to the interposer between the interposer and the stack of memory dies.

18. The method of claim 17, further comprising forming a redistribution network on the interposer that electrically couples the solder bumps to the stack of semiconductor dies.

19. The method of claim 18 wherein forming the redistribution network includes forming a circuit element electrically coupled between the stack of memory dies and the interposer.

20. The method of claim 19 wherein the circuit element includes a capacitor.

21. A semiconductor system, comprising:
a hybrid memory cube (HMC), including
a package substrate,
a thermally conductive casing defining an enclosure,
an interposer attached to the thermally conductive casing within the enclosure,
a stack of semiconductor dies on the interposer and within the enclosure, wherein the stack of dies projects from the interposer to a first height, and wherein the stack of dies includes a stack of memory dies and at least one logic die attached to the stack of memory dies, and
a plurality of solder bumps coupled between the interposer and the package substrate, wherein the plurality of solder bumps is adjacent to the stack of semiconductor dies, and wherein each of the solder bumps projects from the interposer to a second height that is about equal to or greater than the first height; and
a driver electrically coupled to the HMC via the package substrate.

* * * * *